(12) United States Patent
Yao et al.

(10) Patent No.: US 9,953,931 B1
(45) Date of Patent: Apr. 24, 2018

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Chih Sheng Yao, Kaohsiung (TW); Huan Wun Li, Kaohsiung (TW); Yu-Chih Lee, Kaohsiung (TW); Wei-Hsuan Lee, Kaohsiung (TW)

(73) Assignee: ADVANCED SEMICONDUCTOR ENGINEERING, INC, Kaohsiung (TW)

( * ) Notice: Subject to any disclaimer, the term of this patent is extended or adjusted under 35 U.S.C. 154(b) by 51 days.

(21) Appl. No.: 15/334,230

(22) Filed: Oct. 25, 2016

(51) Int. Cl.
| | | |
|---|---|---|
| *H01L 21/44* | (2006.01) | |
| *H01L 23/552* | (2006.01) | |
| *H01L 23/498* | (2006.01) | |
| *H01L 23/482* | (2006.01) | |
| *H01L 23/31* | (2006.01) | |
| *H01L 21/48* | (2006.01) | |
| *H01L 21/56* | (2006.01) | |
| *H01L 23/00* | (2006.01) | |

(52) U.S. Cl.
CPC .......... *H01L 23/552* (2013.01); *H01L 21/485* (2013.01); *H01L 21/4853* (2013.01); *H01L 21/565* (2013.01); *H01L 23/3114* (2013.01); *H01L 23/4824* (2013.01); *H01L 23/49838* (2013.01); *H01L 24/16* (2013.01); *H01L 2224/16227* (2013.01)

(58) Field of Classification Search
CPC ............... H01L 23/552; H01L 23/3114; H01L 23/4824; H01L 23/49838; H01L 24/16; H01L 21/485; H01L 21/4853; H01L 21/565
USPC .................. 438/108, 125, 126; 257/723, 724
See application file for complete search history.

(56) References Cited

U.S. PATENT DOCUMENTS

| | | | |
|---|---|---|---|
| 5,570,274 A | 10/1996 | Saito et al. | |
| 6,917,526 B2 | 7/2005 | Ajioka et al. | |
| 7,012,315 B1 | 3/2006 | Campbell | |
| 7,049,682 B1 | 5/2006 | Mathews et al. | |
| 7,049,692 B2 * | 5/2006 | Nishimura | H01L 23/3128 257/686 |
| 7,214,565 B2 * | 5/2007 | Sunohara | H01L 23/5389 257/E21.509 |

(Continued)

*Primary Examiner* — Kevin M Picardat
(74) *Attorney, Agent, or Firm* — Foley & Lardner LLP

(57) ABSTRACT

A semiconductor device package comprises a substrate, a first electronic component, first and second conductive pads, a first frame board, an encapsulation layer, and a conductive layer. The substrate has a first surface and a second surface opposite to the first surface. The first electronic component, the first and second conductive pads, and the first frame board are on the first surface of the substrate. The first frame board surrounds the first electronic component and comprises a first conductive via and a second electronic component. The encapsulation layer encapsulates the first electronic component and the first frame board. The conductive layer is on the first frame board and the encapsulation layer. The first conductive via is electrically connected to the second conductive pad and the conductive layer, and the second electronic component is electrically connected to the first conductive pad.

21 Claims, 6 Drawing Sheets

(56) References Cited

U.S. PATENT DOCUMENTS

| | | | |
|---|---|---|---|
| 7,629,674 B1 | 12/2009 | Foster | |
| 8,227,338 B1 | 7/2012 | Scanlan et al. | |
| 8,350,388 B2 * | 1/2013 | Sasaoka | H01L 23/5389 257/723 |
| 8,558,377 B2 * | 10/2013 | Yoo | H01L 23/13 257/659 |
| 8,685,792 B2 * | 4/2014 | Chow | H01L 25/03 257/678 |
| 2008/0099911 A1 * | 5/2008 | Machida | H01L 23/13 257/723 |
| 2010/0140779 A1 * | 6/2010 | Lin | H01L 23/49816 257/690 |
| 2011/0286194 A1 * | 11/2011 | Kawabata | H05K 1/141 361/803 |
| 2012/0146178 A1 | 6/2012 | Hoang et al. | |
| 2014/0054080 A1 * | 2/2014 | Sato | H05K 1/183 174/266 |

* cited by examiner

SEMICONDUCTOR DEVICE PACKAGE AND A METHOD OF MANUFACTURING THE SAME

BACKGROUND

1. Technical Field

The present disclosure relates to a semiconductor device package and a method of manufacturing the same. In particular, the present disclosure relates to a semiconductor device package including a frame board.

2. Description of the Related Art

In a semiconductor device package, an electromagnetic interference (EMI) shield is formed on an encapsulation layer. Conductive vias may be formed in the encapsulation layer to electrically connect a substrate of the semiconductor device package to the EMI shield. Laser drilling, etching or mechanical drilling technique may be used to form the conductive vias. However, aperture ratio, over-etching, and misalignment may adversely affect a shielding effect.

SUMMARY

In an aspect according to some embodiments, a semiconductor device package comprises a substrate, a first electronic component, first and second conductive pads, a first frame board, an encapsulation layer, and a conductive layer. The substrate has a first surface and a second surface opposite to the first surface. The first electronic component, the first and second conductive pads, and the first frame board are on the first surface of the substrate. The first frame board surrounds the first electronic component and comprises a first conductive via and a second electronic component. The encapsulation layer encapsulates the first electronic component and the first frame board. The conductive layer is on the first frame board and the encapsulation layer. The first conductive via is electrically connected to the second conductive pad and the conductive layer, and the second electronic component is electrically connected to the first conductive pad.

In an aspect according to some embodiments, a semiconductor device package comprises a substrate, a first electronic component, a first conductive pad, a second conductive pad, a frame board, an encapsulation layer, and a conductive layer. The substrate has a top surface. The first electronic component, the first conductive pad, and the second conductive pad are on the top surface of the substrate. The frame board surrounds the first electronic component, and the frame board comprises a first conductive post directly on the first conductive pad, a second conductive post directly on the second conductive pad, and a second electronic component directly on the first conductive post and the second conductive post. The encapsulation layer encapsulates the first electronic component and the frame board. The conductive layer is on the frame board and the encapsulation layer.

In an aspect according to some embodiments, a semiconductor device package comprises a substrate, a first electronic component, a first conductive pad, a second conductive pad, a frame board, an encapsulation layer, and a conductive layer. The substrate has a top surface. The first electronic component, the first conductive pad, and the second conductive pad are on the top surface of the substrate. The frame board defines a cavity, and the frame board comprises a first conductive post on the first conductive pad, a second conductive post on the second conductive pad, and a second electronic component. The first electronic component is disposed in the cavity, and the second electronic component includes a first terminal directly on the first conductive post and a second terminal directly on the second conductive post. The encapsulation layer fills the cavity and encapsulates the first electronic component. The conductive layer is on the frame board and the encapsulation layer.

In an aspect according to some embodiments, a method of manufacturing a semiconductor device package comprises: 1) providing a substrate comprising a first surface, a second surface opposite to the first surface, a first conductive pad on the first surface of the substrate and a second conductive pad on the first surface of the substrate; 2) attaching a first electronic component to the first surface of the substrate; 3) placing a frame board on the first conductive pad and the second conductive pad to surround the first electronic component; 4) encapsulating the first electronic component and the frame board by an encapsulation layer; 5) removing a part of the encapsulation layer to expose the frame board; and 6) forming a conductive layer on the frame board and the encapsulation layer.

DETAILED DESCRIPTION

Figure 1:
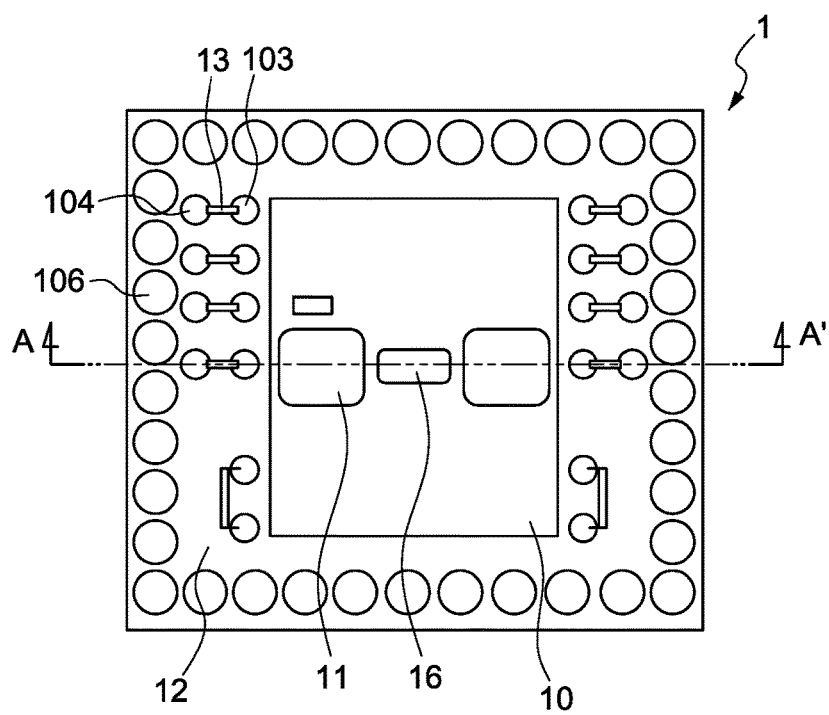
FIG. 1 is a top view of a semiconductor device package in accordance with some embodiments of the present disclosure.

Common reference numerals are used throughout the drawings and the detailed description to indicate the same or similar components. Embodiments of the present disclosure will be more apparent from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

FIG. 1 is a top view of a semiconductor device package 1 in accordance with some embodiments of the present disclosure. The semiconductor device package 1 includes a substrate 10, electronic components 11, 13 and 16, and a frame board 12.

The substrate 10 may include, for example and without limitation, a printed circuit board. The substrate 10 may include conductive traces, via and pads (not shown in FIG. 1) for electrical connection.

The electronic components 11 and 16 may include active components (e.g., controllers or integrated circuits (ICs)), passive components (e.g., a resistor, an inductor or a capacitor) or other components. The electronic components 11 and 16 are disposed on the substrate 10. The electronic components 11 and 16 are disposed close to a center of the substrate 10 and on a central region of the substrate 10. It is contemplated that the semiconductor device package 1 may include additional electronic components on the substrate 10 than shown in FIG. 1 to form a circuitry that includes the electronic components 11 and 16.

Conductive pads 103, 104 and 106 are disposed on the substrate 10. The conductive pads 106 are disposed on a peripheral region of the substrate 10 and surround the conductive pads 103 and 104. A dimension (e.g., a diameter or a width) of the conductive pads 106 is greater than a dimension of the conductive pads 103 and 104, such as, for example, at least about 1.1 times greater, or at least about 1.3 times greater, or at least about 1.5 times greater. The conductive pads 106 are grounded. The conductive pads 103 are electrically connected to the circuitry on the substrate 10; for example, the conductive pads 103 may be electrically connected to the electronic components 11 and 16. The grounded conductive pads 106 may enhance EMI protection of signals transmitted through the conductive pads 103. The conductive pads 103, 104 and 106 may be considered as part of the substrate 10.

The frame board 12 may include, for example and without limitation, a printed circuit board. The frame board 12 is disposed on the substrate 10 and has a through hole or cavity corresponding to and exposing the central region of the substrate 10, on which the electronic components 11 and 16 are disposed. The frame board 12 is disposed on the peripheral region of the substrate 10. The frame board 12 surrounds the circuitry, which may include the electronic components 11 and 16, on the substrate 10. The frame board 12 includes the electronic components 13. The electronic components 13 are embedded in the frame board 12. The electronic components 13 are integrated in the frame board 12. The electronic components 13 may be passive components; for example, at least one of the electronic components 13 may be a resistor, an inductor or a capacitor. The electronic components 13, together with the electronic components 11 and 16 on the substrate 10, may form a circuitry of the semiconductor device package 1. It is contemplated that more or less electronic components 13 may be integrated into the frame board 12 to provide a relatively compact circuit design without expanding surface area of the substrate 10. In FIG. 1, certain components of the frame board 12 are omitted so as to not obscure components on the substrate 10.

Figure 2:
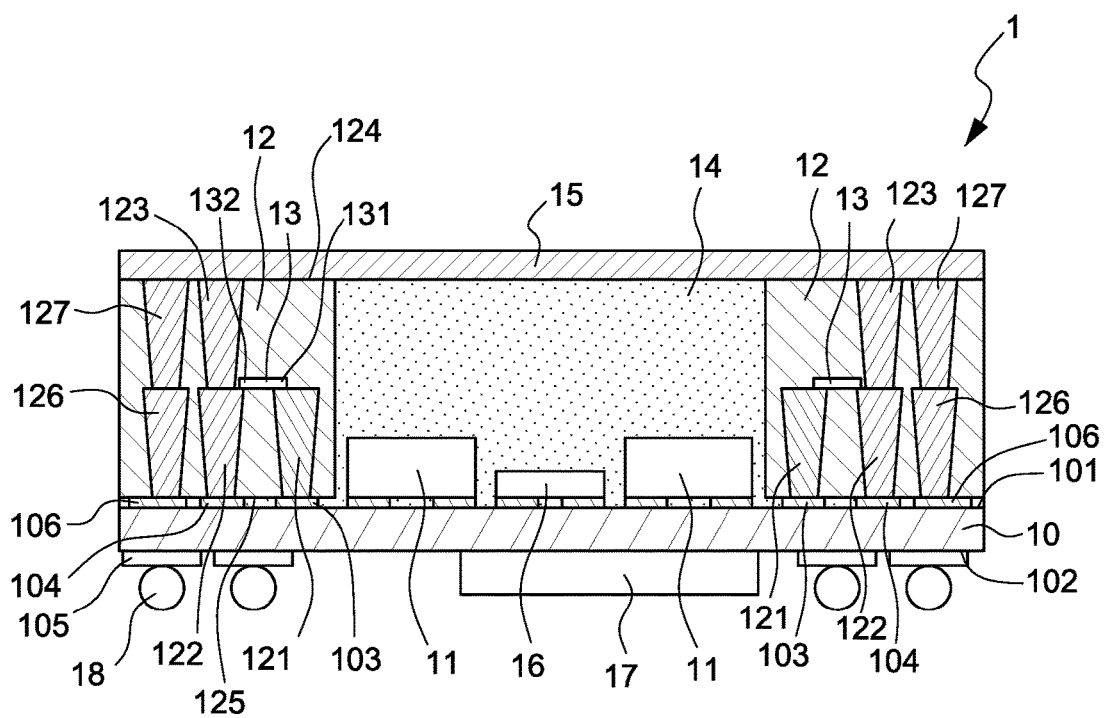
FIG. 2 is a cross-sectional view of a semiconductor device package in accordance with some embodiments of the present disclosure.

FIG. 2 is a cross-sectional view of the semiconductor device package 1 across line AA' in accordance with some embodiments of the present disclosure. The substrate 10 has a first surface 101 (e.g., a top surface) and a second surface 102 (e.g., a bottom surface) opposite to the first surface 101. The electronic component 11 and the electronic component 16 are disposed on the first surface 101 of the substrate 10. The conductive pads 103, 104, and 106 are disposed on the first surface 101 of the substrate 10. The frame board 12 defines the cavity corresponding to the central region of the substrate 10, on which the electronic components 11 and 16 are disposed.

The semiconductor device package 1 includes an encapsulation layer 14 and a conductive layer 15. The frame board 12 is encapsulated by the encapsulation layer 14. The cavity defined by the frame board 12 is filled by the encapsulation layer 14. The electronic components 11 and 16 are also encapsulated by the encapsulation layer 14. The conductive layer 15 is disposed on the frame board 12 and the encapsulation layer 14.

The frame board 12 has a surface 124 (e.g., a top surface) and a surface 125 (e.g., a bottom surface) opposite to the surface 124. The frame board 12 includes conductive vias 121, 122, 123, 126, and 127. The electronic component 13 is embedded in the frame board 12. Each conductive via 121, 122, 123, 126, or 127 may be a conductive post. The conductive via 121 is electrically connected to the conductive pad 103. In some embodiments, the conductive via 121 may be directly on and in contact with the conductive pad 103. The conductive via 122 is electrically connected to the conductive pad 104. In some embodiments, the conductive via 122 may be directly on and in contact with the conductive pad 104. The conductive via 126 is electrically connected to the conductive pad 106. In some embodiments, the conductive via 126 may be directly on and in contact with the conductive pad 106. The conductive via 123 is electrically connected to the conductive via 122. In some embodiments, the conductive via 123 may be directly on and in contact with the conductive via 122. The conductive via 127 is electrically connected to the conductive via 126. In some embodiments, the conductive via 127 may be directly on and in contact with the conductive via 126. The conductive via 121 and the conductive pad 103 may be used to transmit electrical signals. The conductive pads 104 and 106 may be connected to ground paths. Since the conductive layer 15 is electrically connected to the conductive pads 104 and 106 through the conductive vias 122, 123, 126 and 127, the conductive layer 15 is grounded and may be used for EMI shielding. The multiple conductive vias 126 and 127 are connected to the conductive pads 106 surrounding the multiple conductive pads 103 and provide an enhanced capability for EMI shielding. In some embodiments, the use of the multiple conductive pads 104 and 106 can provide an improved EMI shielding structure. The number of the conductive pads 104 and 106 may be adjusted based on design specifications.

In some embodiments, the conductive pads 103, 104 and 106 are correspondingly connected to the conductive vias 121, 122 and 126 in the frame board 12. In some embodiments, since there is no deviation or over-etching during a process for fabricating the semiconductor device package 1, a yield is improved, and the process of fabrication is more stable.

The electronic component 13 includes a terminal 131 and a terminal 132. The terminal 131 directly contacts the conductive via 121, and the terminal 132 directly contacts the conductive via 122. The electronic component 13 is electrically connected between the conductive via 121 and the conductive via 122. The electronic component 13 is electrically connected to the conductive pad 103 through the conductive via 121. The electronic component 13 is electrically connected to the conductive pad 104 through the conductive via 122.

Dimensions of the electronic component 13 may be modified with a scaling of the semiconductor device package 1. A length of the electronic component 13 may be about 0.1 mm to about 0.7 mm. A width of the electronic component 13 may be about 0.1 mm to about 0.4 mm. A height of the electronic component 13 may be about 0.1 mm to about 0.4 mm. In some embodiments, the electronic component 13 has a size 0201 whose length, width, and height are respectively about 0.6 mm, about 0.3 mm, and about 0.3 mm. In other embodiments, the electronic component 13 has a size 01005 whose length, width, and height are respectively about 0.2 mm, about 0.2 mm, and about 0.2 mm. Similar to the electronic component 13, which is a passive component embedded in the frame board 12, the electronic component 16 (e.g., a resistor, an inductor or a capacitor) may be embedded in the frame board 12. In some embodiments, a height of the frame board 12 (Z direction) is efficiently used to accommodate additional devices or components. The use or design of an area (X-Y directions) on the surface 101 of the substrate 10 may be rendered more flexible by embedding components in the frame board 12.

An electronic component 17 is disposed on the second surface 102 of the substrate 10. The electronic component 17 may include an active component or a passive component. Conductive pads 105 are disposed on the second surface 102 of the substrate 10. Interconnect structures 18 are disposed on a peripheral region of the second surface 102 and surround the electronic component 17. The interconnect structures 18 may include solder bumps or solder balls for assembly. The interconnect structures 18 are electrically connected to their respective conductive pads 105. The conductive pads 105 may be considered as part of the substrate 10.

Figure 3:
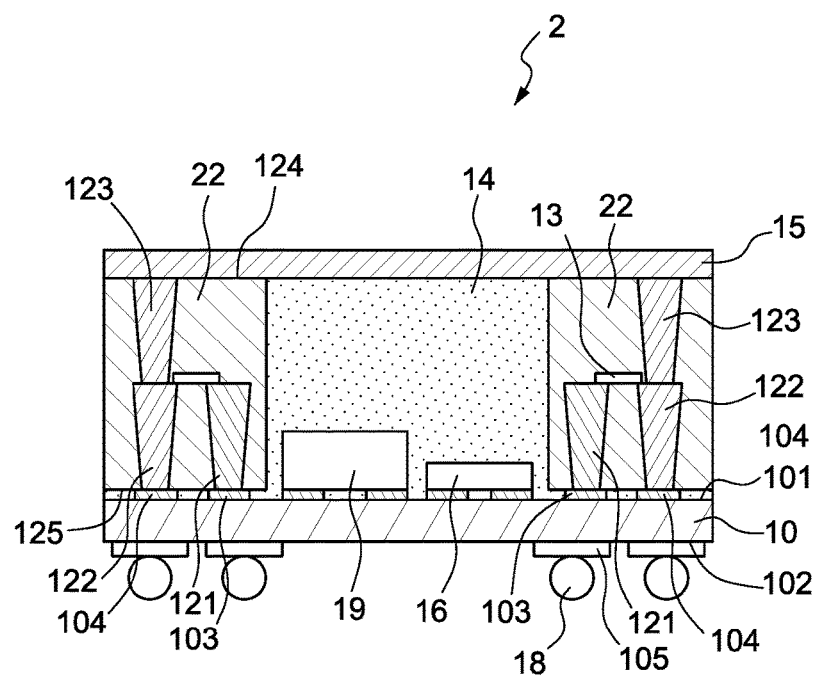
FIG. 3 is a cross-sectional view of a semiconductor device package in accordance with some embodiments of the present disclosure.

FIG. 3 is a cross-sectional view of a semiconductor device package 2 in accordance with some embodiments of the present disclosure. The semiconductor device package 2 is similar to the semiconductor device package 1, except that the conductive pads 106 and the conductive vias 126 and 127 are omitted. The semiconductor device package 2 includes electronic components 16, 13 and 19, and a frame board 22.

The electronic components 16 and 19 may include passive components (e.g., a resistor, an inductor or a capacitor), active components (e.g., controllers or ICs), or other components. The electronic components 16 and 19 are disposed on the first surface 101 of the semiconductor substrate 10. The frame board 22 is disposed on the substrate 10. The frame board 22 is disposed on the peripheral region of the substrate 10, and surrounds a circuitry, which may include the electronic components 16 and 19, on the substrate 10. That is, the frame board 22 defines a cavity corresponding to and exposing the central region of the substrate 10, on which the electronic components 16 and 19 are disposed, and the cavity is filled with the encapsulation layer 14.

The frame board 22 includes the conductive vias 121, 122, and 123. The electronic component 13 is embedded in the frame board 22. The conductive via 121 is electrically connected to the conductive pad 103. The conductive via 122 is electrically connected to the conductive pad 104. The conductive via 123 is electrically connected to the conductive via 122. The conductive via 121 and the conductive pad 103 may be used to transmit electrical signals. The conductive pad 104 may be connected to a ground path. Since the conductive layer 15 is electrically connected to conductive pad 104 through the conductive vias 122 and 123, the conductive layer 15 is grounded and may be used for EMI shielding. In some embodiments, the use of the multiple conductive pads 104 can provide an improved EMI shielding structure. The number of the conductive pads 104 may be adjusted based on design specifications.

Figure 4:
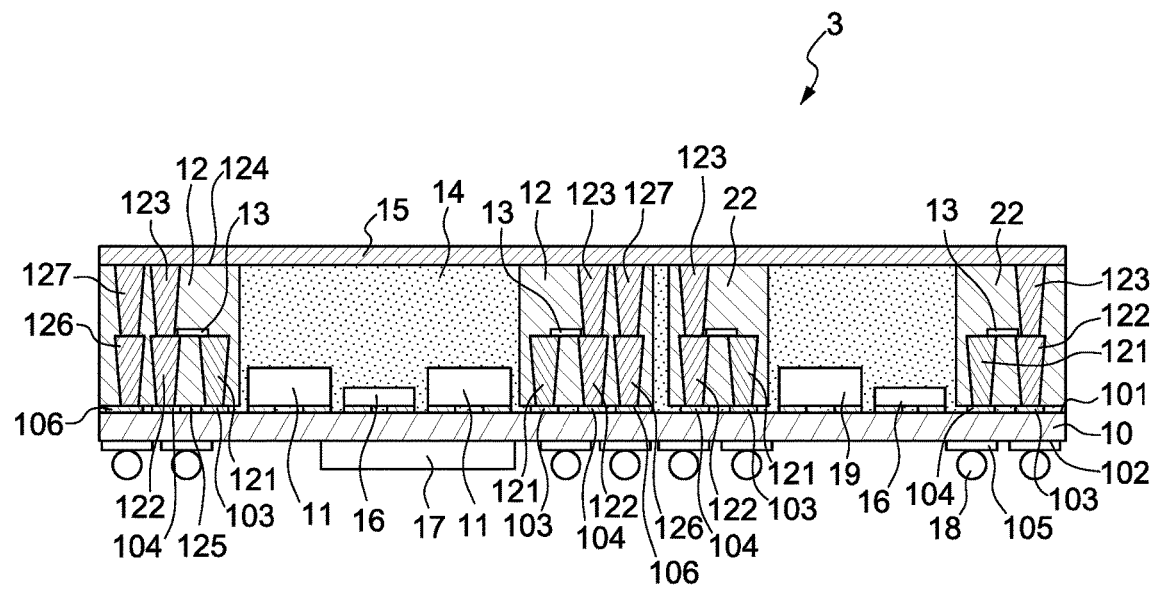
FIG. 4 is a cross-sectional view of a semiconductor device package in accordance with some embodiments of the present disclosure.

FIG. 4 is a cross-sectional view of a semiconductor device package 3 in accordance with some embodiments of the present disclosure. The semiconductor device package 3 includes a combination of the semiconductor device package 1 as described and illustrated with reference to FIG. 2 and the semiconductor device package 2 as described and illustrated with reference to FIG. 3. The frame board 22 is adjacent to the frame board 12. The frame board 12 along with the conductive pads 103, 104, and 106 are similarly implemented as the embodiments of FIG. 2. The frame board 22 along with the conductive pads 103 and 104 are similarly implemented as the embodiments of FIG. 3. The electronic components 13 may be embedded in the frame boards 12 and 22. In some embodiments, the electronic components 13 are embedded in the frame boards 12 and 22 to conserve an area of the substrate 10.

In some embodiments, the frame board 22 may be placed on the substrate 10 to surround the frame board 12, additional active components, additional passive components, or a combination of other different circuit designs. In other embodiments, the frame board 12 may be placed on the substrate 10 to surround the frame board 22, additional active components, additional passive components, or a combination of other different circuit designs.

FIG. 5A, FIG. 5B, FIG. 5C, FIG. 5D, FIG. 5E, FIG. 5F and FIG. 5G illustrate a method of manufacturing a semiconductor device package in accordance with some embodiments of the present disclosure.

Figure 5A:
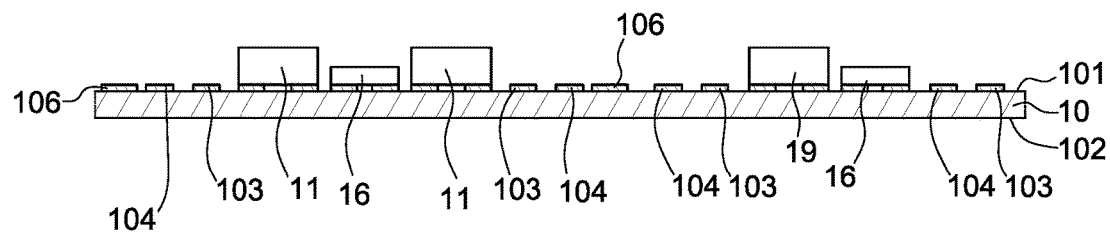
FIG. 5A, FIG. 5B, FIG. 5C, FIG. 5D, FIG. 5E, FIG. 5F and FIG. 5G illustrate a method of manufacturing a semiconductor device package according to some embodiments of the present disclosure.

Referring to FIG. 5A, the substrate 10 is provided. The substrate 10 has the first surface 101 and the second surface 102. The first surface 101 is opposite to the second surface 102. The conductive pads 103, 104, and 106 are disposed on the first surface 101 of the substrate 10. The electronic components 11, 16, and 19 are attached on the first surface 101 of the substrate 10.

Figure 5B:
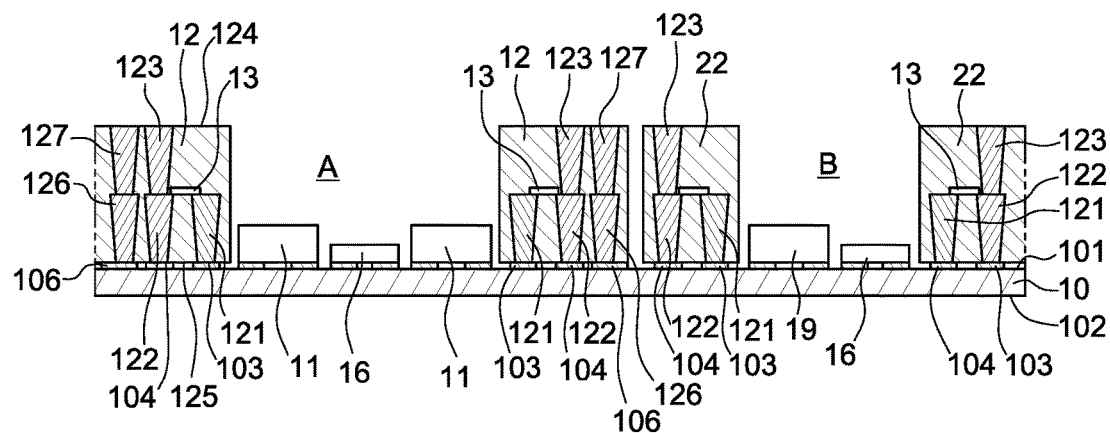

Referring to FIG. 5B, the frame boards 12 and 22 are provided on the substrate 10. The frame board 12 defines a cavity A corresponding to a location of the substrate 100 on which the components 11 and 16 are disposed. That is, the frame board 12 surrounds the electronic components 11 and the electronic component 16. The frame board 22 defines a cavity B corresponding to a location of the substrate 100 on which the components 16 and 19 are disposed. That is, the frame board 22 surrounds the electronic component 16 and the electronic component 19.

The frame board 12 includes the conductive vias 121, 122, 123, 126, and 127. The frame board 12 has the top surface 124 and the bottom surface 125 opposite to the top surface 124. The conductive vias 121, 122, and 126 are exposed from the bottom surface 125. The frame board 12 is placed on the first surface 101 of the substrate 10, and the conductive vias 121, 122 and 126 are electrically connected to the conductive pads 103, 104, and 106 respectively. A material of the frame board 12 surrounding the conductive vias 121, 122, 123, 126, and 127 may be an insulating material. The frame board 22 has a similar structure to the frame board 12. The frame board 22 is placed on the first surface 101 of the substrate 10, and the conductive vias 122 and 121 are electrically connected to the conductive pads 103 and 104, respectively. The electronic component 13 may be embedded in the frame board 12 or in the frame board 22. The electronic component 13 contacts the conductive vias 121 and 122. The embedding of the electronic component 13 may establish an electrical connection.

Figure 5C:
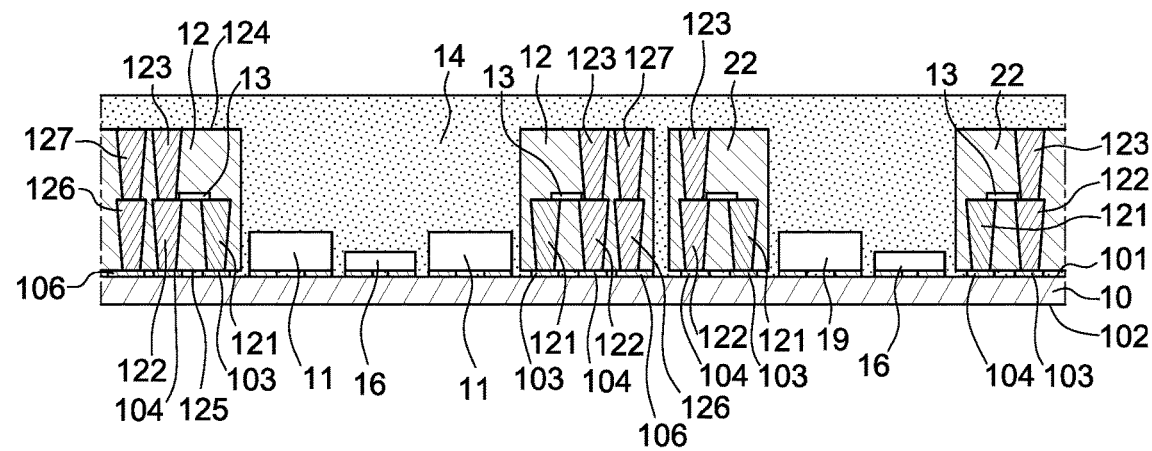

Referring to FIG. 5C, the frame boards 12 and 22 are encapsulated by the encapsulation layer 14. That is, the top surfaces 124 of the frame boards 12 and 22 are covered by the encapsulation layer 14. The electronic components 11, 16 and 19 are also encapsulated by the encapsulation layer 14. A material of the encapsulation layer 14 may be a molding compound, such as a resin with dispersed fillers. The material of the encapsulation layer 14 may be different from the material of the frame boards 12 and 22.

Figure 5D:
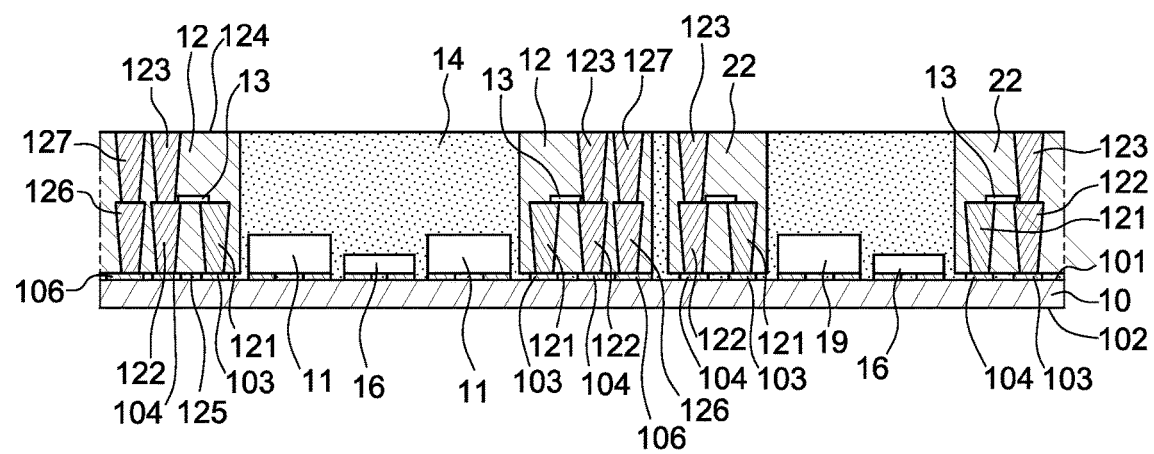

Referring to FIG. 5D, the encapsulation layer 14 is subjected to grinding to expose the top surfaces 124 of the frame boards 12 and 22. The conductive vias 123 and 127 of the frame board 12 are exposed from the top surface 124 of the frame board 12. The conductive via 123 of the frame board 22 is exposed from the top surface 124 of the frame board 22.

Figure 5E:
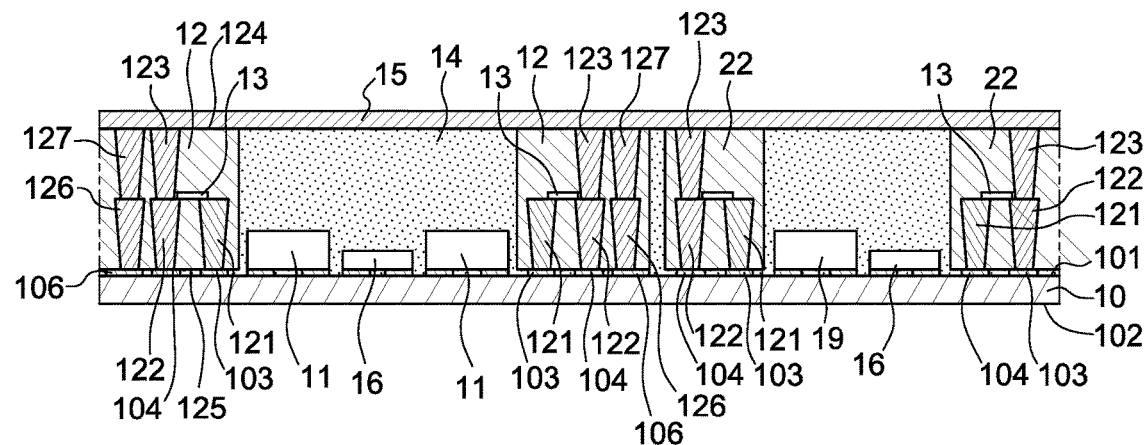

Referring to FIG. 5E, the conductive layer 15 is formed on the frame boards 12 and 22 and the encapsulation layer 14 by coating, electroplating, printing or sputtering. A material of the conductive layer 15 may include a metal or a metal alloy. The conductive vias 123 and 127 of the frame board 12 and the conductive via 123 of the frame board 22 are electrically connected to the conductive layer 15. In some embodiments, the connection of the conductive pad 106, the conductive vias 126 and 127, and the conductive layer 15 forms an EMI shielding path. In some embodiments, the connection of the conductive pad 104, the conductive vias 122 and 123, and the conductive layer 15 forms an EMI shielding path. At this stage, a package structure is thus obtained.

Figure 5F:
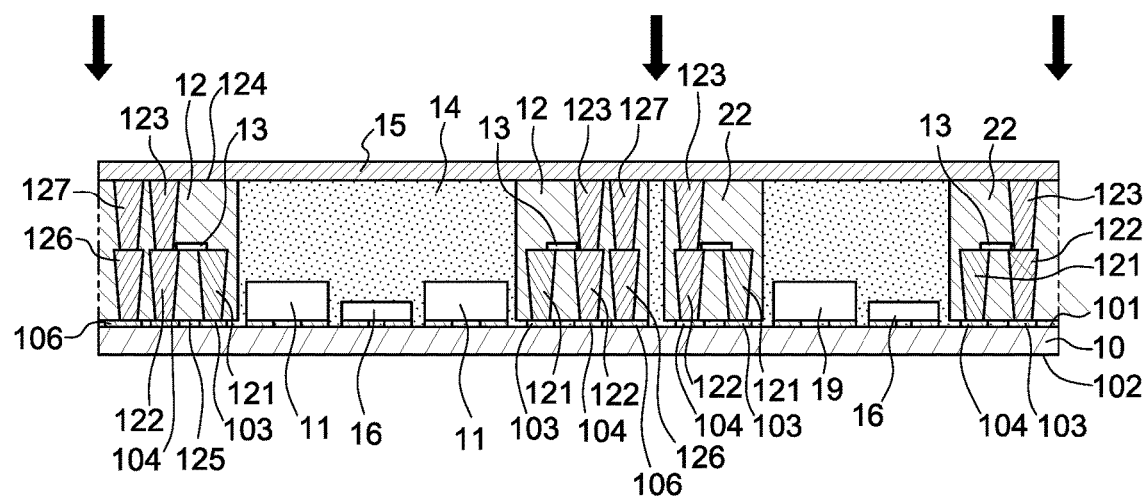
Figure 5G:
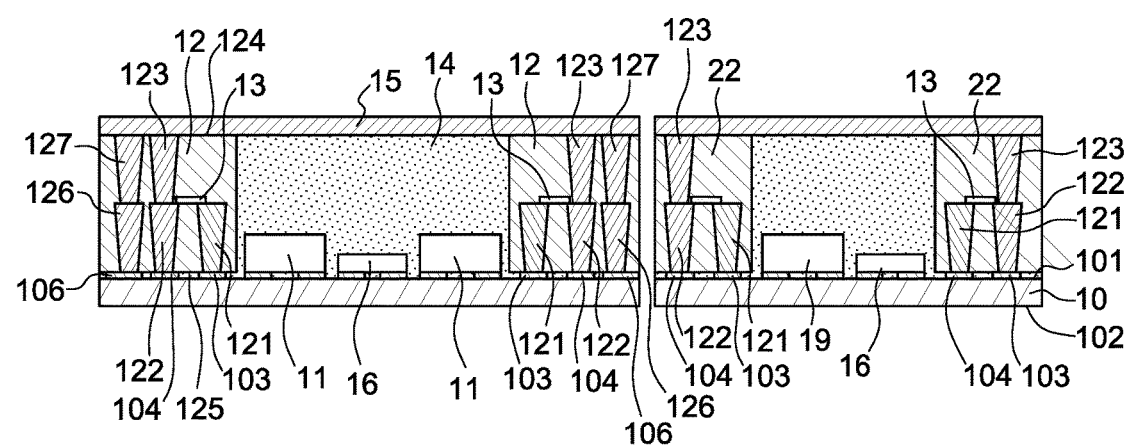

Referring to FIG. 5F, the package structure is singulated. Referring to FIG. 5G, after the singulation operation, the package structure is divided into the individual semiconductor device package 1 and the semiconductor device package 2.

As used herein, the singular terms "a," "an," and "the" may include plural referents unless the context clearly dictates otherwise.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
   a substrate having a first surface and a second surface opposite to the first surface;
   a first electronic component on the first surface of the substrate;
   a first conductive pad on the first surface of the substrate;
   a second conductive pad on the first surface of the substrate;
   a first frame board on the first surface of the substrate and surrounding the first electronic component, the first frame board comprising a first conductive via and a second electronic component;
   an encapsulation layer encapsulating the first electronic component and the first frame board; and
   a conductive layer on the first frame board and the encapsulation layer,
   wherein the first conductive via is electrically connected to the second conductive pad and the conductive layer, and the second electronic component is electrically connected to the first conductive pad.

2. The semiconductor device package of claim 1, further comprising a plurality of third conductive pads on the first surface of the substrate, wherein the third conductive pads surround the first conductive pad.

3. The semiconductor device package of claim 2, wherein the third conductive pads surround the second conductive pad.

4. The semiconductor device package of claim 2, wherein a dimension of each of the third conductive pads is greater than a dimension of the first conductive pad.

5. The semiconductor device package of claim 1, wherein the first frame board defines a cavity, and the first electronic component is disposed in the cavity.

6. The semiconductor device package of claim 5, further comprising a third electronic component on the first surface of the substrate, wherein the third electronic component is disposed outside the cavity and is encapsulated by the encapsulation layer.

7. The semiconductor device package of claim 6, further comprising a second frame board on the first surface of the substrate and surrounding the third electronic component, wherein the second frame board comprises a second conductive via and a fourth electronic component.

8. The semiconductor device package of claim 1, wherein the first frame board further comprises a second conductive via, and the second electronic component is electrically connected to the first conductive pad through the second conductive via.

9. The semiconductor device package of claim 8, wherein the second electronic component is electrically connected between the first conductive via and the second conductive via.

10. The semiconductor device package of claim 1, further comprising a third electronic component on the second surface of the substrate and a plurality of interconnect structures on a peripheral region of the second surface of the substrate surrounding the third electronic component.

11. The semiconductor device package of claim 1, wherein the first frame board comprises a top surface and a bottom surface opposite to the top surface, and the first conductive via is exposed from the top surface to electrically connect to the conductive layer and is exposed from the bottom surface to electrically connect to the second conductive pad.

12. The semiconductor device package of claim 1, wherein the conductive layer, the first conductive via, and the second conductive pad form an electromagnetic interference (EMI) shielding path.

13. A semiconductor device package, comprising:
a substrate having a top surface;
a first electronic component on the top surface of the substrate;
a first conductive pad on the top surface of the substrate;
a second conductive pad on the top surface of the substrate;
a frame board surrounding the first electronic component, the frame board comprising a first conductive post directly on the first conductive pad, a second conductive post directly on the second conductive pad, and a second electronic component directly on the first conductive post and the second conductive post;
an encapsulation layer encapsulating the first electronic component and the frame board; and
a conductive layer on the frame board and the encapsulation layer.

14. The semiconductor device package of claim 13, further comprising a third conductive post directly on the second conductive post.

15. The semiconductor device package of claim 13, further comprising a plurality of third conductive pads on the top surface of the substrate, wherein the third conductive pads surround the first electronic component.

16. The semiconductor device package of claim 15, wherein the frame board further comprises a plurality of third conductive posts directly on respective ones of the third conductive pads.

17. The semiconductor device package of claim 15, wherein a dimension of each of the third conductive pads is greater than a dimension of the second conductive pad.

18. The semiconductor device package of claim 13, wherein the frame board defines a cavity exposing the top surface of the substrate, and the first electronic component is disposed in the cavity.

19. The semiconductor device package of claim 18, further comprising a third electronic component on the top surface of the substrate, wherein the third electronic component is disposed outside the cavity and is encapsulated by the encapsulation layer.

20. The semiconductor device package of claim 13, wherein the frame board comprises a top surface, a bottom surface opposite to the top surface of the frame board, and a third conductive post on the second conductive post, the third conductive post is exposed from the top surface of the frame board to contact the conductive layer, and the second conductive post is exposed from the bottom surface of the frame board to contact the second conductive pad.

21. A semiconductor device package, comprising:
a substrate having a top surface;
a first electronic component on the top surface of the substrate;
a first conductive pad on the top surface of the substrate;
a second conductive pad on the top surface of the substrate;
a frame board defining a cavity exposing the top surface of the substrate, the frame board comprising a first conductive post on the first conductive pad, a second conductive post on the second conductive pad, and a second electronic component, the first electronic component is disposed in the cavity, and the second electronic component includes a first terminal directly on the first conductive post and a second terminal directly on the second conductive post;
an encapsulation layer filling the cavity and encapsulating the first electronic component; and
a conductive layer on the frame board and the encapsulation layer.

* * * * *